(12) United States Patent
Schrank et al.

(10) Patent No.: US 10,468,541 B2
(45) Date of Patent: Nov. 5, 2019

(54) SEMICONDUCTOR DEVICE WITH THROUGH-SUBSTRATE VIA AND CORRESPONDING METHOD OF MANUFACTURE

(71) Applicant: ams AG, Unterpremstaetten (AT)

(72) Inventors: Franz Schrank, Graz (AT); Sara Carniello, Graz (AT); Hubert Enichlmair, Weinitzen (AT); Jochen Kraft, Oberaich (AT); Bernhard Loeffler, Gleisdorf (AT); Rainer Holzhaider, Graz (AT)

(73) Assignee: ams AG, Unterpremstaetten (AT)

( * ) Notice: Subject to any disclaimer, the term of this patent is extended or adjusted under 35 U.S.C. 154(b) by 67 days.

(21) Appl. No.: 15/107,901

(22) PCT Filed: Dec. 12, 2014

(86) PCT No.: PCT/EP2014/077587
§ 371 (c)(1),
(2) Date: Jun. 23, 2016

(87) PCT Pub. No.: WO2015/097002
PCT Pub. Date: Jul. 2, 2015

(65) Prior Publication Data
US 2016/0322519 A1 Nov. 3, 2016

(30) Foreign Application Priority Data
Dec. 27, 2013 (EP) ..................................... 13199683

(51) Int. Cl.
*H01L 31/0224* (2006.01)
*H01L 21/768* (2006.01)
(Continued)

(52) U.S. Cl.
CPC ................ *H01L 31/022408* (2013.01); *H01L 21/76898* (2013.01); *H01L 23/481* (2013.01);
(Continued)

(58) Field of Classification Search
CPC ......... H01L 31/02002; H01L 31/02016; H01L 31/0224; H01L 27/01636; H01L 23/481
See application file for complete search history.

(56) References Cited

U.S. PATENT DOCUMENTS

| | | |
|---|---|---|
| 4,940,636 A | 7/1990 | Brock et al. |
| 2002/0019069 A1 | 2/2002 | Wada |

(Continued)

FOREIGN PATENT DOCUMENTS

| | | |
|---|---|---|
| DE | 102011013228 A1 | 9/2012 |
| WO | 2012031845 A1 | 3/2012 |

OTHER PUBLICATIONS

Bouchoucha, M. et al, "Reliability Study of 3D-WLP through Silicon via with Innovative Polymer Filling Integration", 2011 Electronics Components and Technology Conference, pp. 567-572.

*Primary Examiner* — Jamie C Niesz
(74) *Attorney, Agent, or Firm* — Fish & Richardson P.C.

(57) ABSTRACT

A dielectric layer (2) is arranged on the main surface (10) of a semiconductor substrate (1), and a passivation layer (6) is arranged on the dielectric layer. A metal layer (3) is embedded in the dielectric layer above an opening (12) in the substrate, and a metallization (14) is arranged in the opening. The metallization contacts the metal layer and forms a through-substrate via to a rear surface (11) of the substrate. A layer or layer sequence (7, 8, 9) comprising at least one further layer is arranged on the passivation layer above the opening. In this way the bottom of the through-substrate via is stabilized. A plug (17) may additionally be arranged in the opening without filling the opening.

15 Claims, 2 Drawing Sheets

(51) Int. Cl.
*H01L 23/48* (2006.01)
*H01L 27/146* (2006.01)
*H01L 31/0216* (2014.01)
*H01L 31/103* (2006.01)
*H01L 31/18* (2006.01)
*H01L 23/00* (2006.01)
*H01L 23/31* (2006.01)

(52) U.S. Cl.
CPC .. *H01L 27/14636* (2013.01); *H01L 31/02165* (2013.01); *H01L 31/103* (2013.01); *H01L 31/1804* (2013.01); *H01L 23/3192* (2013.01); *H01L 23/562* (2013.01); *H01L 2924/0002* (2013.01)

(56) References Cited

U.S. PATENT DOCUMENTS

| | | |
|---|---|---|
| 2008/0128848 A1 | 6/2008 | Suzuki et al. |
| 2009/0302480 A1 | 12/2009 | Birner et al. |
| 2010/0096718 A1 | 4/2010 | Hynecek et al. |
| 2010/0213560 A1* | 8/2010 | Wang ............... H01L 27/14621 257/432 |
| 2010/0264503 A1 | 10/2010 | Inoue et al. |
| 2010/0321544 A1 | 12/2010 | Matsuo et al. |
| 2010/0327383 A1* | 12/2010 | Hayasaki .......... H01L 21/76898 257/432 |
| 2011/0001205 A1* | 1/2011 | Sul ................... H01L 27/14621 257/432 |
| 2011/0108988 A1* | 5/2011 | Lim .................. H01L 21/76898 257/751 |
| 2011/0169139 A1 | 7/2011 | Lin et al. |
| 2011/0193240 A1 | 8/2011 | Farooq et al. |
| 2012/0146210 A1 | 6/2012 | Oganesian et al. |
| 2012/0248580 A1 | 10/2012 | Matsugai et al. |
| 2013/0020468 A1* | 1/2013 | Mitsuhashi ....... H01L 27/14627 250/208.1 |
| 2013/0181317 A1 | 7/2013 | Wakiyama et al. |
| 2013/0228698 A1 | 9/2013 | Ide |
| 2013/0252416 A1 | 9/2013 | Takeda et al. |

* cited by examiner

SEMICONDUCTOR DEVICE WITH THROUGH-SUBSTRATE VIA AND CORRESPONDING METHOD OF MANUFACTURE

BACKGROUND OF THE INVENTION

DE 10 2011 013 228 A1 discloses a manufacturing method for semiconductor devices. Two stop layers are arranged on a passivation layer above a semiconductor substrate. A handling wafer is applied and thinned until the upper stop layer is reached. The upper stop layer is then removed selectively with respect to the lower stop layer, which can be TiN or tungsten. The passivation layer and the lower stop layer cover an area above a through-substrate via.

WO 2012/031845 A1 discloses a manufacturing method for semiconductor devices with a through-substrate via. A metal plane embedded in a dielectric layer is arranged on a semiconductor substrate. A base substrate comprising a contact area on an insulated connection metal plane is connected to the semiconductor substrate. A contact hole is formed through the dielectric layer and the semiconductor substrate, and the contact area is thereby exposed. A metallization is applied to form a connection contact on the contact area and a through-contact in the contact hole.

If a through-silicon via is completely filled, it may be damaged by thermomechanical stress between the filler and the silicon owing to different coefficients of thermal expansion. For reference see the publication of M. Bouchoucha et. al., "Reliability Study of 3D-WLP Through Silicon Via with Innovative Polymer Filling Integration", 2011 IEEE 61st Electronic Components and Technology Conference, pp. 567-572.

SUMMARY OF THE INVENTION

The semiconductor device comprises a substrate of semiconductor material. The substrate has a main surface, a rear surface opposite the main surface, and an opening penetrating the substrate between the main surface and the rear surface. A dielectric layer is arranged on the main surface, and a passivation layer is arranged on the dielectric layer. A metal layer is embedded in the dielectric layer above the opening, and a metallization is arranged in the opening. The metallization contacts the metal layer and forms a through-substrate via to the rear surface. A layer or layer sequence comprising at least one further layer is arranged on the passivation layer above the opening. The through-substrate via is not filled, so that an inner volume of the opening remains void or contains a gas like ambient air.

In an embodiment of the semiconductor device, the at least one further layer is a bond oxide layer.

In a further embodiment of the semiconductor device, the layer or layer sequence comprises at least two further layers.

In a further embodiment of the semiconductor device, a plug is arranged in the opening near the metal layer and partially fills the opening.

In a further embodiment the plug is a polymer.

In a further embodiment the plug is a photosensitive dielectric material.

In a further embodiment the layer or layer sequence comprises a further dielectric layer of a material different from the passivation layer. The further dielectric layer may be formed from an oxide of the semiconductor material.

In a further embodiment the layer or layer sequence comprises a filter layer, which may be formed from a material of an interference filter. In particular, the filter layer may comprise at least one combination of oxides selected from the group consisting of $TiO_2/SiO_2$, $Nb_2O_5/SiO_2$ and $HfO/SiO_2$.

A further embodiment comprises a sensor in the substrate, the sensor is provided for the detection of radiation, and the filter layer is arranged above the sensor.

In a further embodiment the layer or layer sequence comprises a protection coating.

In a further embodiment the protection coating comprises at least one material selected from the group consisting of benzocyclobutene, polybenzoxazoles, siloxane-based polymers or silicones, epoxies, polyimides, polynorbornenes and materials based on phenol resin.

In a further embodiment the protection coating comprises a photosensitive material or a photoresist.

In a further embodiment the protection coating is recessed above the opening.

The method of producing a semiconductor device comprises the steps of providing a substrate of semiconductor material having a main surface and a rear surface opposite the main surface, applying a dielectric layer and a metal layer embedded in the dielectric layer on the main surface, applying a passivation layer on the dielectric layer, forming an opening from the rear surface to the metal layer, and arranging a metallization in the opening, so that the metallization contacts the metal layer and forms a through-substrate via to the rear surface. A layer or layer sequence comprising at least one further layer is deposited on the passivation layer above the opening. The through-substrate via is not filled, so that an inner volume of the opening remains void or contains a gas like ambient air.

In a variant of the method, the opening is partially filled with a dielectric polymer.

In a further variant of the method the layer or layer sequence is applied including a protection coating, which is formed from a dielectric polymer and at least partially removed above the opening.

In a further variant of the method, a sensor provided for the detection of radiation is arranged in the substrate, the layer or layer sequence is applied including a filter layer formed from a material comprising at least one combination of oxides selected from the group consisting of $TiO_2/SiO_2$, $Nb_2O_5/SiO_2$ and $HfO/SiO_2$, and a protection coating above the filter layer. The protection coating is completely removed from an area above the sensor.

The following is a detailed description of examples of the semiconductor device and the method.

DETAILED DESCRIPTION

Figure 1:
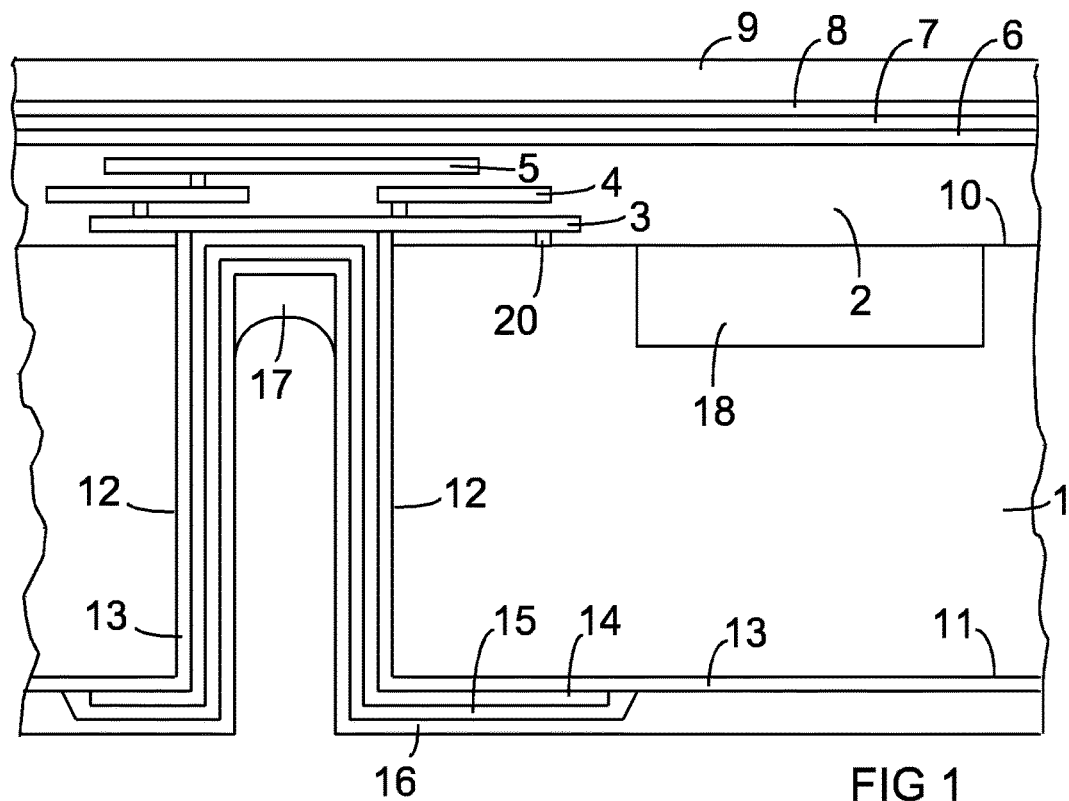
FIG. 1 is a cross section of an embodiment of the semiconductor device comprising a filter layer and a protection coating over a partially filled through-substrate via.

FIG. 1 is a cross section of an embodiment of the semiconductor device, which comprises a substrate 1 of semiconductor material like silicon, for example. A dielectric layer 2 is arranged on or above a main surface 10 of the substrate 1. A metal layer 3 is embedded in the dielectric layer 2. Any number of further metal layers 4, 5 may also be embedded in the dielectric layer 2 as a wiring, and the dielectric layer 2 forms an intermetal dielectric. The metal layers 3, 4, 5 are structured and connected via vertical interconnects 20, which may be formed as metal plugs, for example. A passivation layer 6 is applied on the dielectric layer 2.

A layer or layer sequence comprising at least one further layer is arranged on the passivation layer 6. In the embodiment shown in FIG. 1 as an example, the layer or layer sequence comprises a further dielectric layer 7, a filter layer 8 and a protection coating 9. These layers represent the layer or layer sequence in the appended figures as an example. The layer or layer sequence of further embodiments may differ by the number and/or the materials of the layers. In some embodiments at least one of the layers of the layer sequence comprises an oxide of the semiconductor material and may in particular be a bond oxide layer. In other embodiments none of the layers that are arranged above the passivation layer 6 comprises an oxide of the semiconductor material.

In the embodiment according to FIG. 1, the further dielectric layer 7 comprises a material that is different from the passivation layer 6. The further dielectric layer 7 may be an oxide like silicon dioxide, for example, and may especially be a bond oxide used for the application of a handling wafer or the like during the manufacturing process. But the further dielectric layer 7 is optional and need not be applied even if a handling wafer is used, because the handling wafer may instead be bonded by a polymer layer, for example.

The filter layer 8 may be provided for an integrated sensor 18 detecting radiation like a photodetector, for example, and may be formed from a material of an interference filter. If a sensor 18 is integrated and a layer forming an interference filter is arranged above the sensor 18, this layer can thus serve to stabilize the through-substrate via as part of the layer sequence above the opening 12. In particular, the filter layer 8 may be formed as a stack of at least two layers of different indices of refraction and may especially comprise at least one oxide. Combinations of materials that are suitable for the filter layer 8 are $TiO_2/SiO_2$, $Nb_2O_5/SiO_2$ or $HfO/SiO_2$, for example. The filter layer 8 has a typical thickness of a few micrometers up to about 10 µm, optionally a thickness in the range from 3 µm to 12 µm, for example. If the dielectric layer 7 is not present, the filter layer 8 may be arranged immediately on the passivation layer 6.

A further oxide layer, in particular a layer comprising an oxide that is also applied in the filter layer 8, may be applied above the filter layer 8, especially between the filter layer 8 and the protection coating 9. The further oxide layer may be thicker than the corresponding oxide layer of the filter layer 8.

The protection coating 9 may be a permanent dielectric polymer, for example. In particular, materials suitable for the protection coating 9 are benzocyclobutene (BCB), polybenzoxazoles (PBO), siloxane-based polymers or silicones, epoxies, polyimides, polynorbornenes and materials based on phenol resin. The protection coating 9 may especially be a photoresist, especially a UV-curable photoresist, which can be hardened by ultraviolet radiation, for example. Suitable photoresists are commercially available.

The layer sequence 7, 8, 9 may comprise other materials, and the number of layers may be varied. The materials can be selected with the aim of optimizing the robustness of the through-substrate via.

An opening 12 extends through the substrate 1 between the main surface 10 and the rear surface 11. A dielectric layer 13 is optionally provided to insulate the semiconductor material of the substrate 1 in the opening 12 and at the rear surface 11. A metallization 14 is arranged in the opening 12 so that the metallization 14 contacts the metal layer 3 and forms a through-substrate via from the metal layer 3 to the rear surface 11. The metallization 14 may be covered by a dielectric layer 15, and a passivation layer 16 may be applied to the entire area of the rear surface 11. Contact areas of the metallization 14 can be uncovered to allow an external electrical connection. The through-substrate via is optionally not filled, so that an inner volume of the opening 12 remains void or contains a gas like ambient air.

A plug 17 can be arranged in the opening 12 near the metal layer 3 to stabilize the bottom of the through-substrate via. The plug 17 may be confined to a small volume near the metal layer 3. The plug 17 can be the same material as the protection coating 9, like a polymer, for example, in particular a photosensitive dielectric material, which is commercially available. As the opening 12 is not filled, thermomechanical stress is avoided. Otherwise stress might occur because of different coefficients of thermal expansion of the plug 17 and the semiconductor material, especially during thermal steps of the manufacturing process. A layer of photoresist may be applied to form the plug 17. If a portion of the photoresist layer is also applied over the rear surface 11, it is exposed to radiation, developed and removed, so that only the portion of the photoresist layer that is intended to form the plug 17 remains. The remaining portion of the photoresist layer may be cured, typically for one hour at 200° C., for example, to produce the plug 17.

Figure 2:
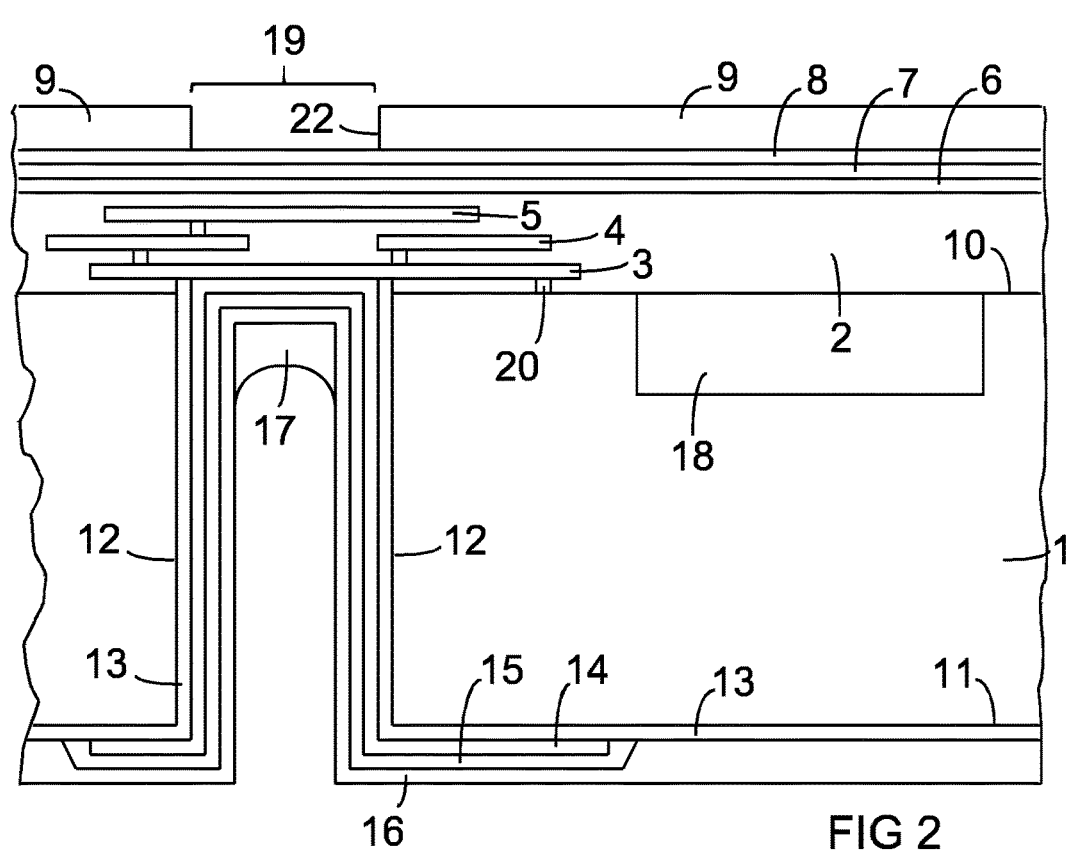
FIG. 2 is a cross section according to FIG. 1 for an embodiment wherein the protection coating is open in an area above the through-substrate via.

FIG. 2 is a cross section according to FIG. 1 for a further embodiment. Elements of the embodiment according to FIG. 2 that are similar to corresponding elements of the embodiment according to FIG. 1 are designated with the same reference numerals. In the embodiment according to FIG. 2, the protection coating 9 is removed in an area 19 above the opening 12 of the through-substrate via and forms a recess 22. The further dielectric layer 7 and, optionally, the filter layer 8 or similar layers of different materials suffice to stabilize the bottom of the through-substrate via. The recess 22 of the protection coating 9 is intended to mitigate the accidental presence of small particles in the region above the opening 12. A small particle may transfer a force exerted by some manufacturing tool to the bottom of the through-substrate via and thus damage the electrical connection between the metal layer 3 and the metallization 14. If the particle enters the recess 22 and if the size of the particle does not exceed the thickness of the protection coating 9, which may typically be in the range from 15 µm to 30 µm, especially about 20 µm, for example, the particle will not protrude from the recess 22 and will not exceed the level of the upper surface plane of the protection coating 9. Consequently the particle is out of reach of a flat tool that is larger than the dimension of the recess 22 and therefore cannot transfer pressure to the bottom of the through-substrate via.

Figure 3:
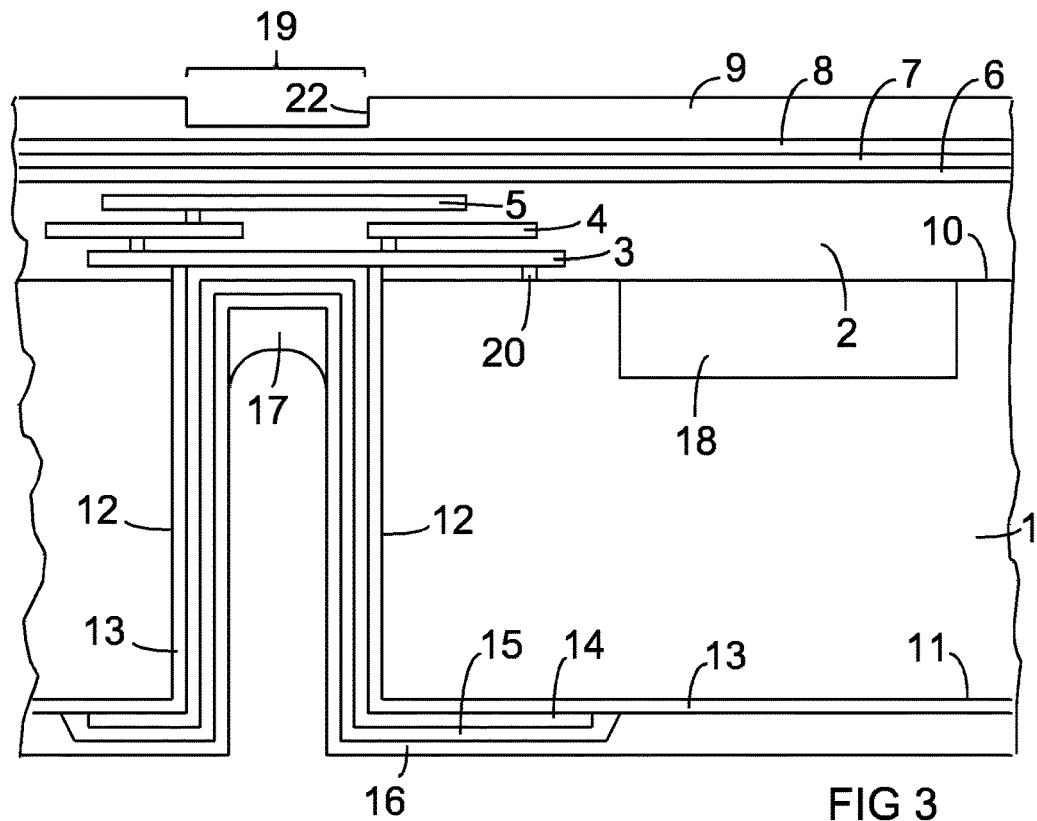
FIG. 3 is a cross section according to FIG. 2 for an embodiment wherein the protection coating is only partially recessed above the through-substrate via.

FIG. 3 is a cross section according to FIG. 2 for a further embodiment. Elements of the embodiment according to FIG. 3 that are similar to corresponding elements of the embodiment according to FIG. 2 are designated with the same reference numerals. In the embodiment according to FIG. 3, the protection coating 9 is only partially removed in an area 19 above the opening 12 of the through-substrate via. Thus a thin layer portion of the protection coating 9 remains in the area 19, and a recess 22 is only formed within the protection coating 9. Hence the recess 22 is shallower than the recess 22 of the embodiment according to FIG. 2. The shallow recess 22 still accommodates a particle of sufficiently small size, while the reinforcement of the bottom of the through-substrate via is stronger than in the embodiment according to FIG. 2. The depth of the recess 22 can be adapted to obtain an optimal compromise.

Figure 4:
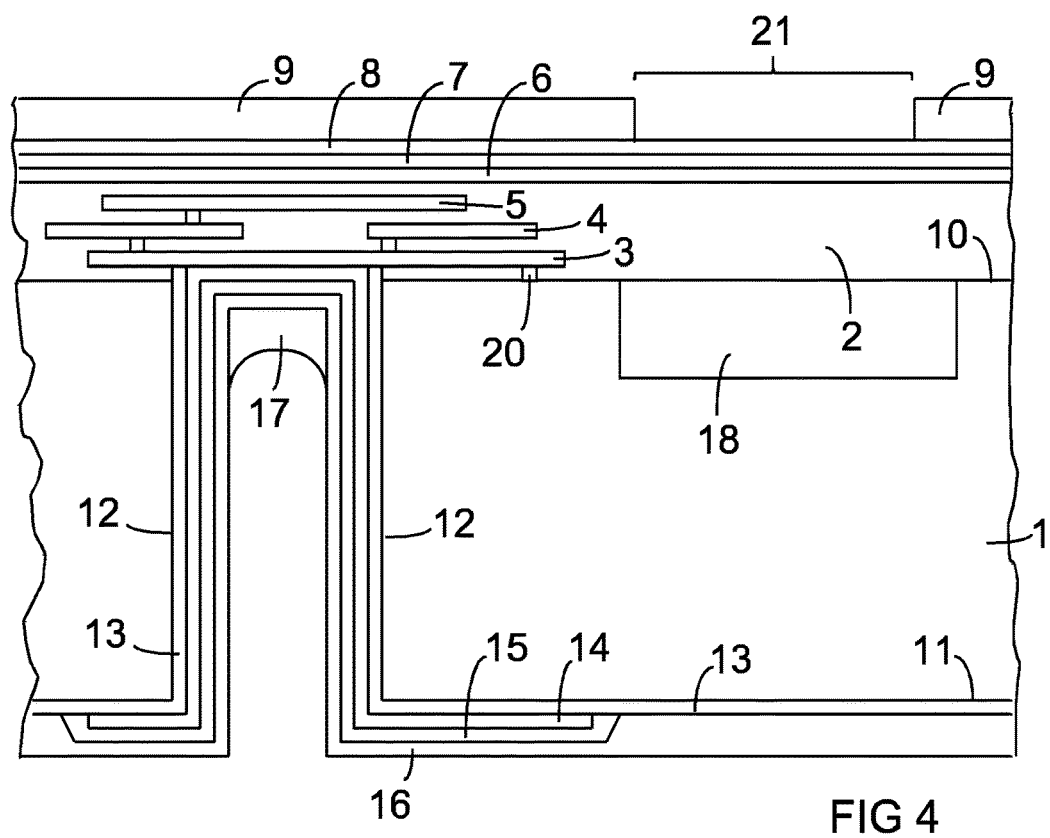
FIG. 4 is a cross section according to FIG. 1 for an embodiment wherein upper layers are removed over an integrated sensor.

FIG. 4 is a cross section according to FIG. 1 for a further embodiment. Elements of the embodiment according to FIG. 4 that are similar to corresponding elements of the embodiment according to FIG. 1 are designated with the same reference numerals. In the embodiment according to FIG. 4, a sensor 18 is integrated in the substrate 1. The layer or layer sequence 7, 8, 9 is at least partially recessed in an area 21 above the sensor 18. This embodiment may be especially suitable if an opaque material or materials that are not transparent for the radiation that is to be detected by the sensor 18 are used in the layer or layer sequence 7, 8, 9. Some or all of the opaque layers are removed from the sensor area 21. If a filter layer 8 is provided for the sensor 18, the layers arranged above the filter layer 8, in particular the protection coating 9, can be removed above the sensor 18 to enhance the incidence of radiation.

This structure allows to improve the robustness of the membrane formed by the bottom region of a through-substrate via and to enhance the resistance against the action of an external mechanical force on the membrane. One or more additional layers on top of the through-substrate via, in particular on the side where circuit components like CMOS components are integrated in the semiconductor device, and a partial filling inside the through-substrate via provide a mechanical and thermomechanical reinforcement. Embodiments are additionally provided with cavities created over the through-substrate via in order to prevent particles from pushing onto the membrane.

The invention claimed is:

1. A semiconductor device, comprising:
   a substrate of semiconductor material with a main surface, a rear surface opposite the main surface, and an opening through the substrate between the main surface and the rear surface;
   a dielectric layer on the main surface;
   a passivation layer on the dielectric layer;
   a metal layer embedded in the dielectric layer above the opening;
   a metallization arranged in the opening, the metallization contacting the metal layer and forming a through-substrate via to the rear surface;
   a layer sequence arranged on the passivation layer and comprising at least one further dielectric layer and a filter layer;
   the through-substrate via not being filled, so that an inner volume of the opening remains void or contains ambient air;
   a membrane formed by a bottom region of the through-substrate via, the bottom region of the through-substrate via including the metal layer embedded in the dielectric layer above the opening and a region of the metallization contacting the metal layer;
   a plug partially filling the opening, the plug being entirely confined within the opening the opening being next to the metal layer,
   wherein
   each of the passivation layer, the at least one further dielectric layer and the filter layer are present above the entire opening,
   the passivation layer is applied immediately on the dielectric layer,
   the further dielectric layer and the filter layer are applied immediately one on the other,
   one of the further dielectric layer and the filter layer is applied immediately on the passivation layer,
   the at least one further dielectric layer is of a material different from the passivation layer, and
   each of the dielectric layer and the further dielectric layer comprises a solid material.

2. The semiconductor device of claim 1, wherein the at least one further dielectric layer is a bond oxide layer.

3. The semiconductor device of claim 1, wherein the layer sequence comprises at least two further dielectric layers.

4. The semiconductor device of claim 1, wherein the plug is a polymer.

5. The semiconductor device of claim 1, wherein the plug is a photosensitive dielectric material.

6. The semiconductor device of claim 1, wherein the filter layer comprises at least one combination of oxides selected from the group consisting of $TiO_2/SiO_2$, $Nb_2O_5/SiO_2$ and $HfO/SiO_2$.

7. The semiconductor device of claim 1, further comprising a sensor in the substrate, the sensor being provided for the detection of radiation, and the filter layer being arranged above the sensor.

8. The semiconductor device of claim 1, wherein the layer sequence comprises a protection coating.

9. The semiconductor device of claim 8, wherein the protection coating comprises at least one material selected from the group consisting of benzocyclobutene, polybenzoxazoles, siloxane-based polymers or silicones, epoxies, polyimides, polynorbornenes and materials based on phenol resin.

10. The semiconductor device of claim 8, wherein the protection coating comprises a photosensitive material or a photoresist.

11. The semiconductor device of claim 8, wherein the protection coating is recessed above the opening.

12. A method of producing a semiconductor device, comprising:
   providing a substrate of semiconductor material having a main surface and a rear surface opposite the main surface;
   applying a dielectric layer and a metal layer embedded in the dielectric layer on the main surface;
   applying a passivation layer on the dielectric layer;
   forming an opening from the rear surface to the metal layer;
   arranging a metallization in the opening, the metallization contacting the metal layer and forming a through-substrate via to the rear surface;
   depositing a layer sequence on the passivation layer, the layer sequence comprising at least one further dielectric layer and a filter layer;
   reinforcing a membrane formed by a bottom region of the through-substrate via to enhance a resistance against an action of an external mechanical force on the membrane, the bottom region of the through-substrate via including the metal layer embedded in the dielectric layer above the opening and a region of the metallization contacting the metal layer, wherein reinforcing a membrane comprises partially filling the opening with a plug, the plug being entirely confined within the opening, the opening being next to the metal layer, and not filling the through-substrate via, so that an inner volume of the opening remains void or contains ambient air, wherein
- each of the passivation layer, the at least one further dielectric layer and the filter layer are present above the entire opening,
- the passivation layer is applied immediately on the dielectric layer,
- the further dielectric layer and the filter layer are applied immediately one on the other,
- one of the further dielectric layer and the filter layer is applied immediately on the passivation layer,
- the at least one further dielectric layer is of a material different from the passivation layer, and
- each of the dielectric layer and the further dielectric layer comprises a solid material.

13. The method of claim 12,
wherein partially filling the opening with the plug comprises partially filling the opening with a dielectric polymer.

14. The method of claim 12, wherein the layer sequence includes a protection coating, which is formed from a dielectric polymer and at least partially removed above the opening.

15. The method of claim 12, further comprising:
arranging a sensor provided for the detection of radiation in the substrate, wherein the filter layer comprises at least one combination of oxides selected from the group consisting of $TiO_2/SiO_2$, $Nb_2O_5/SiO_2$ and $HfO/SiO_2$, and a protection coating above the filter layer, the protection coating being removed from an area above the sensor.

* * * * *